US012725717B2

(12) United States Patent
Hobart et al.

(10) Patent No.: US 12,725,717 B2
(45) Date of Patent: Sep. 1, 2026

(54) SEMICONDUCTOR BETAVOLTAIC BATTERY WITH INTEGRATED BETA EMITTER

(71) Applicants: Karl D. Hobart, Alexandria, VA (US); Marko J. Tadjer, Vienna, VA (US); Bernard F. Phlips, Great Falls, VA (US); Alan G. Jacobs, Rockville, MD (US); John Gahl, Columbia, MO (US); John D. Brockman, Columbia, MO (US)

(72) Inventors: Karl D. Hobart, Alexandria, VA (US); Marko J. Tadjer, Vienna, VA (US); Bernard F. Phlips, Great Falls, VA (US); Alan G. Jacobs, Rockville, MD (US); John Gahl, Columbia, MO (US); John D. Brockman, Columbia, MO (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 385 days.

(21) Appl. No.: 18/431,314

(22) Filed: Feb. 2, 2024

(65) Prior Publication Data

US 2025/0253067 A1 Aug. 7, 2025

(51) Int. Cl.
*G21H 1/06* (2006.01)
*G21G 1/06* (2006.01)
(Continued)

(52) U.S. Cl.
CPC ................ *G21H 1/06* (2013.01); *G21G 1/06* (2013.01); *H10D 8/00* (2025.01); *H10P 34/40* (2026.01); *H10D 62/80* (2025.01)

(58) Field of Classification Search
CPC .. G21H 1/06; G21G 1/06; H10D 8/00; H10D 62/80; H10D 8/045; H10D 8/051;
(Continued)

(56) References Cited

U.S. PATENT DOCUMENTS 7,939,986 B2 5/2011 Chandrashekhar et al.
8,134,216 B2 * 3/2012 Spencer .................. G21H 1/02 257/29

(Continued)

FOREIGN PATENT DOCUMENTS

CN 11446019 A 7/2020
CN 114203325 A 3/2022

OTHER PUBLICATIONS

Betavoltaic cell based on Ni/β-Ga2O3 and 63Ni Source (Year: 2021).*

(Continued)

*Primary Examiner* — Ahmed Elnakib
(74) *Attorney, Agent, or Firm* — US Naval Research Laboratory; Jorie L. Stroup

(57) ABSTRACT

An electrically inactive betavoltaic battery, an electrically active betavoltaic battery, and methods of making the same are provided. In implementations, a method of making an electrically active betavoltaic battery includes: providing an electrically inactive betavoltaic battery device having one or more diodes incorporating a semiconductor material layer having a stable non-radioactive isotope; and irradiating the electrically inactive betavoltaic battery device with thermal neutrons, thereby causing the conversion of at least a portion of the stable non-radioactive isotope to a radionuclide and creating the electrically active betavoltaic battery, wherein the semiconductor material layer acts as both an electron emitter and an electron absorber simultaneously.

20 Claims, 9 Drawing Sheets

(51) Int. Cl.
*H10D 8/00* (2025.01)
*H10D 62/80* (2025.01)
*H10P 34/40* (2026.01)

(58) Field of Classification Search
CPC .. H10D 62/82; H10D 62/8303; H10D 62/834; H10D 62/875; H10P 34/40
USPC .......................................................... 310/303
See application file for complete search history.

(56) References Cited

U.S. PATENT DOCUMENTS

| | | | | |
|---|---|---|---|---|
| 8,487,392 | B2 | 7/2013 | Spencer et al. | |
| 8,860,161 | B2 * | 10/2014 | Dowben | H10F 30/29 257/E31.028 |
| 11,764,322 | B2 | 9/2023 | Hubbard et al. | |
| 12,462,944 | B1 * | 11/2025 | Cabauy | A61N 1/378 |
| 2006/0108605 | A1 * | 5/2006 | Yanagihara | H10D 8/051 257/481 |
| 2006/0186378 | A1 | 8/2006 | Putman | |
| 2010/0123084 | A1 * | 5/2010 | Fox | G01T 1/24 257/77 |
| 2011/0241144 | A1 * | 10/2011 | Spencer | G21H 1/02 257/E29.166 |
| 2016/0211042 | A1 | 7/2016 | Burgett | |
| 2022/0238244 | A1 | 7/2022 | Jones et al. | |
| 2024/0312793 | A1 * | 9/2024 | Tadjer | C01G 15/00 |
| 2025/0253067 | A1 * | 8/2025 | Hobart | G21G 1/06 |
| 2026/0011463 | A1 * | 1/2026 | Tadjer | G21H 1/02 |

OTHER PUBLICATIONS

Ni-63 is a P-type layer—Google Search (Year: 2026).*
KR-101546310-B1 (Year: 2015).*
Chen et. al., Near-infrared ight-emitting diodes based on Tm-doped Ga2O3, Journal of Luminescence, 2022, vol. 245, p. 118773.
R.D. Hoffman, Modeled Neutron Induced Nuclear Reaction Cross Sections for Radiochemsitry in the region of Thulium, Lutetium, and Tantalum I. Results of Built in Spherical Symmetry in a Deformed Region, Lawrence Livermore National Laboratory, Sep. 6, 2013, LLNL-TR-643519.
Honsberg et al., GaN Betavoltaic Energy Converters, IEEE, Jan. 2005, Print ISBN:0-7803-8707-4.
Khan et al., Design and characterization of GaN p-i-n diodes for betavoltaic devices, Solid-State Electronics, 2017, vol. 136, pp. 24-29, Elsevier.com.
Lee et al., Effect of 1.5 MeV electron irradiation on ß-Ga2O3 carrier lifetime and diffusion length, Appl. Phys. Lett., 2018, vol. 112, p. 082104, American Institute of Physics.
Manikanthababu et al., Review of Radiation-Induced Effects on ß-Ga2O3 Materials and Devices, Crystals, 2022, vol. 12, p. 1009, MDPI.com.
Maximenko et al., Optimal Semiconductors for 3H and 63Ni Betavoltaics, Scientific Reports, Jul. 26, 2019, vol. 9, p. 10892, www.nature.com.
Hoffmann Festschrift et al., Betavoltaic Nuclear Battery: A Review of Recent Progress and Challenges as an Alternative Energy Source, The Journal of Physical Chemistry, 2023, vol. 127, pp. 7565-7579.
Son et al., Electron Paramegnetic Resonance and Theoretical Study of Gallium Vacancy in ß-Ga2O3, Appl. Phys. Lett., 2020, vol. 117, p. 032101, AIP Publishing.
Unkown, Pure Beta Emitters, University of Wisconsin-Madison, updated Jan. 9, 2009.
Wang et al., Effects of 1 MeV Electron Irradiation on ß-Ga2O3 Photodetectors, ECS Journal of Solid State Science and Technology, The Electrochemical Society, Nov. 2, 2021, vol. 10, p. 115001.
Wong et al., Radiation hardness of ß-Ga 2O3 metal-oxide-semiconductor field-effect transistors against gamma-ray irradiation, Appl. Phys. Lett., AVS, 2018, vol. 112, p. 023503.
Yakimov et al., Betavoltaic cell based on Ni/ß-Ga2O3 and 63Ni source, J. Vac. Sci. Technol. 2022, A 40, p. 010401.
Yakimov, Eugene B., Prediction of Betavoltaic Battery Parameters, Energies, Apr. 27, 2023, vol. 16, p. 3740, MDPI.
Yang et al., 1.5 MeV electron irradiation damage in ß-Ga2O3 vertical rectifiers, Journal of Vacuum Science & Technology B, Nanotechnology and Microelectronics: Materials, Processing, Measurement, and Phenomena, 2017, vol. 35, p. 031208, American Vacuum Society.
Zhao et al., Breaking the myth: Wide-bandgap semiconductors not always the best for betavoltaic batteries, Appl. Phys. Lett., Oct. 14, 2021, vol. 119, p. 153904, AIP Publishing.

* cited by examiner

SEMICONDUCTOR BETAVOLTAIC BATTERY WITH INTEGRATED BETA EMITTER

FEDERALLY SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case No. 211590-US1.

BACKGROUND OF THE INVENTION

Aspects of the present invention relate generally to betavoltaic power sources and, more particularly, to a semiconductor betavoltaic battery.

In general, a battery is a source of electric power derived from chemical energy. A betavoltaic device or betavoltaic battery is a type of nuclear battery which generates electric current from beta particles (electrons) emitted from a radioactive source (i.e., the emitter), using semiconductor junctions (i.e., the absorber). Betavoltaic semiconductor devices use a non-thermal conversion process, ionizing electron-hole pairs produced by beta particles traversing the semiconductor absorber.

Monoclinic beta (β) $Ga_2O_3$ technology has experienced rapid development in recent years. After initial growth demonstrations, melt grown 100 millimeter (mm) diameter substrates have been commercialized using techniques such as edge-defined film-fed (EFG) growth, Czochralski (CZ), float-zone (FZ), and vertical Bridgman (VB). Commercial epitaxial growth techniques have also resulted in 1-10 micron (μm) thick epitaxial layers of high quality, suitable for vertical diode demonstrations in the 5-8 kilovolt (kV) breakdown voltage range. Domestic production of semi-insulating (010) $Ga_2O_3$ substrates has been scaled up to 2 inches using Czochralski and EFG techniques, respectively. The ultra-wide bandgap of β-$Ga_2O_3$ (4.6-4.9 electron volts (eV)) results in a high critical field of 6-8 Megavolts per centimeter (MV/cm) and has also enabled lateral and vertical rectifier and transistor devices potentially suitable for radio frequency and high voltage power switching. In the frequency domain, $Ga_2O_3$ devices face performance challenges due to the low mobility and low thermal conductivity of $Ga_2O_3$. For high power electronics, the main challenge is the absence of p-type conductivity in $Ga_2O_3$ due to hole self-trapping originating from strong polaron effects[1].

SUMMARY OF THE INVENTION

In a first aspect of the invention, there is method of making an electrically active betavoltaic battery comprising: providing an electrically inactive betavoltaic battery device having one or more diodes incorporating a semiconductor material layer including a stable non-radioactive isotope; and irradiating the electrically inactive betavoltaic battery device with thermal neutrons, thereby causing the conversion of at least a portion of the stable non-radioactive isotope to a radionuclide and creating an electrically active betavoltaic battery, wherein the semiconductor material layer acts as both an electron emitter and an electron absorber simultaneously. In implementations, the semiconductor material is gallium oxide ($Ga_2O_3$). In embodiments, the stable non-radioactive isotope is thulium-169 (Tm-169) and the radionuclide is thulium-170 (Tm-170).

In another aspect of the invention, there is a method of making an electrically inactive betavoltaic battery device comprising: fabricating a semiconductor material layer containing a stable isotope9; and fabricating one or more diodes such that the one or more diodes incorporate the semiconductor material layer, thereby creating the electrically inactive betavoltaic battery device, wherein the electrically inactive betavoltaic battery device is configured to be transformed into an electrically active betavoltaic battery upon irradiation with thermal neutrons. In embodiments, the stable non-radioactive isotope is Tm-169 and the radionuclide is Tm-170.

In another aspect of the invention, there is an inactive betavoltaic battery device comprising: a semiconductor material layer including a stable isotope; and one or more diodes incorporating the semiconductor material layer, wherein the electrically inactive betavoltaic battery device is configured to be transformed into an electrically active betavoltaic battery upon irradiation with thermal neutrons. In embodiments, the stable non-radioactive isotope is Tm-169 and the radionuclide is Tm-170.

BRIEF DESCRIPTION OF THE DRAWINGS

Aspects of the present invention are described in the detailed description which follows, in reference to the noted plurality of drawings by way of non-limiting examples of exemplary embodiments of the present invention.

DETAILED DESCRIPTION

Aspects of the present invention relate generally to betavoltaic power sources and, more particularly, to a semiconductor betavoltaic battery. In implementations, a semiconductor material (e.g., gallium (III) oxide ($Ga_2O_3$)) is doped with an appropriate radioisotope which, once irradiated with thermal neutrons, becomes a beta source within the semiconductor material. Embodiments of the invention provide a betavoltaic battery using a radioisotope "host" crystal (semiconductor material) as both a beta particle emitter and an electron absorber simultaneously.

For years, betavoltaic sources have relied on silicon (Si) and more recently silicon carbide (SiC) coated with nickel-63 as the most accessible, reliable, and energetic beta source. Recent efforts in demonstrating $Ga_2O_3$ betavoltaic devices with separate embedding and emitting layers limit the beta source to the relatively low energy helium-3, carbon-14, and nickel-63, due to crystal lattice damage, limiting absorber efficiency at higher irradiation energies.

$Ga_2O_3$ bulk and epitaxial growth has the capability to incorporate a variety of impurities, both intentional and unintentional. When irradiated with thermal neutrons, appropriate impurities in $Ga_2O_3$ will transmute to radioactive nuclides with beta emission decay paths, effectively providing an in situ electron irradiation source embedded within the $Ga_2O_3$ crystal. One example of such an impurity is iridium (Ir), which is the scarcest metal in the Earth's crust but a common unintentional impurity in $Ga_2O_3$ crystals synthesized via the edge-defined film-fed growth (EFG) and Czochralski (CZ) techniques relying on the use of an Ir crucible. Upon neutron irradiation, the radioisotope Ir-192 will be produced via neutron capture. With a half-life of 73 days for the gamma rays resulting, Ir-192 is a strong gamma emitter and is thus undesirable from an electronic device safety perspective. From a betavoltaic perspective, however, $Ga_2O_3$ is attractive because of its relatively good tolerance to gamma irradiation and potentially good tolerance to beta irradiation at 1.5 Megaelectron volt (MeV) and 2.5 MeV energies[2, 3].

Figure 1:
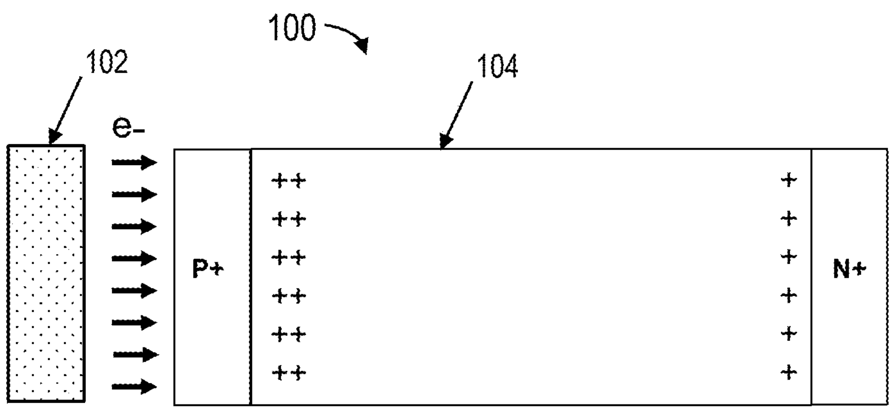
FIG. 1 depicts a prior art betavoltaic semiconductor device according to an embodiment of the present invention.

FIG. 1 depicts a prior art multi-layer betavoltaic semiconductor device 100. As illustrated in FIG. 1, device 100 relies on beta particle (electron) emission from an emitter layer 102 deposited on a semiconductor absorber device 104, typically a p-n junction. This limits the generation current to the vicinity of the metallurgical junction. Unlike such devices, implementations of the invention utilize a semiconductor device as both a beta particle emitter and an electron absorber. More specifically, embodiments of the invention utilize beta emissions from dopants distributed within a semiconductor crystal, which increase the emission volume and the overall power produced by a betavoltaic battery of the present invention as compared to previous multi-layer betavoltaic semiconductor devices.

Figure 2A:
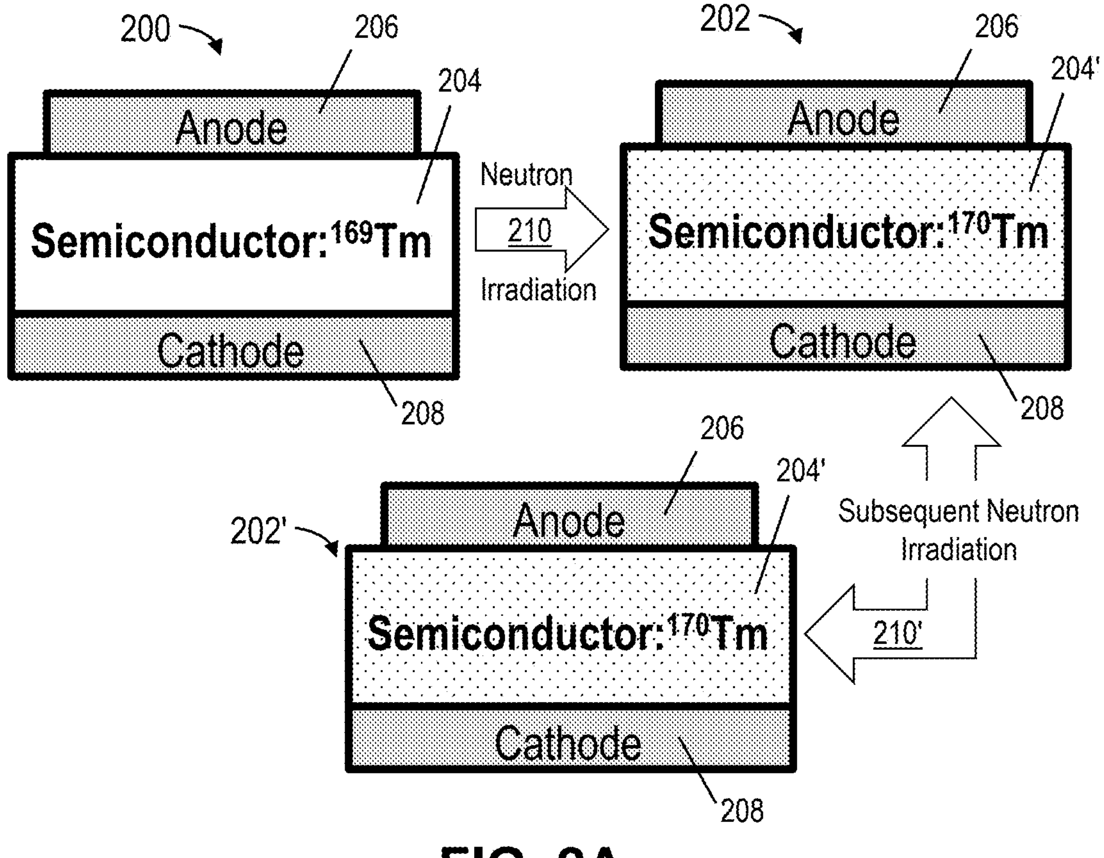
FIG. 2A shows an exemplary inactive betavoltaic battery device, an active betavoltaic battery, and a recharged betavoltaic battery in accordance with embodiments of the invention.

FIG. 2A shows an exemplary electrically inactive betavoltaic battery device 200, an electrically active betavoltaic battery 202 and a recharged electrically active betavoltaic battery 202' in accordance with embodiments of the invention. The exemplary electrically inactive betavoltaic battery device 200 of FIG. 1 includes at least one semiconductor material 204 doped with the only stable (observationally stable) isotope of thulium (Tm), Tm-169, and at least one diode comprising at least one anode 206, and at least one cathode 208. In implementations, the electrically inactive betavoltaic battery device 200 is exposed to thermal neutron irradiation at 210, which converts at least a portion of the Tm-169 in the semiconductor material 204 to the radioisotope Tm-170, resulting in the electrically active betavoltaic battery 202 including an emissive semiconductor substrate 204'. In implementations, the semiconductor 204 comprises $Ga_2O_3$. See, for example, FIG. 2B.

Figure 2B:
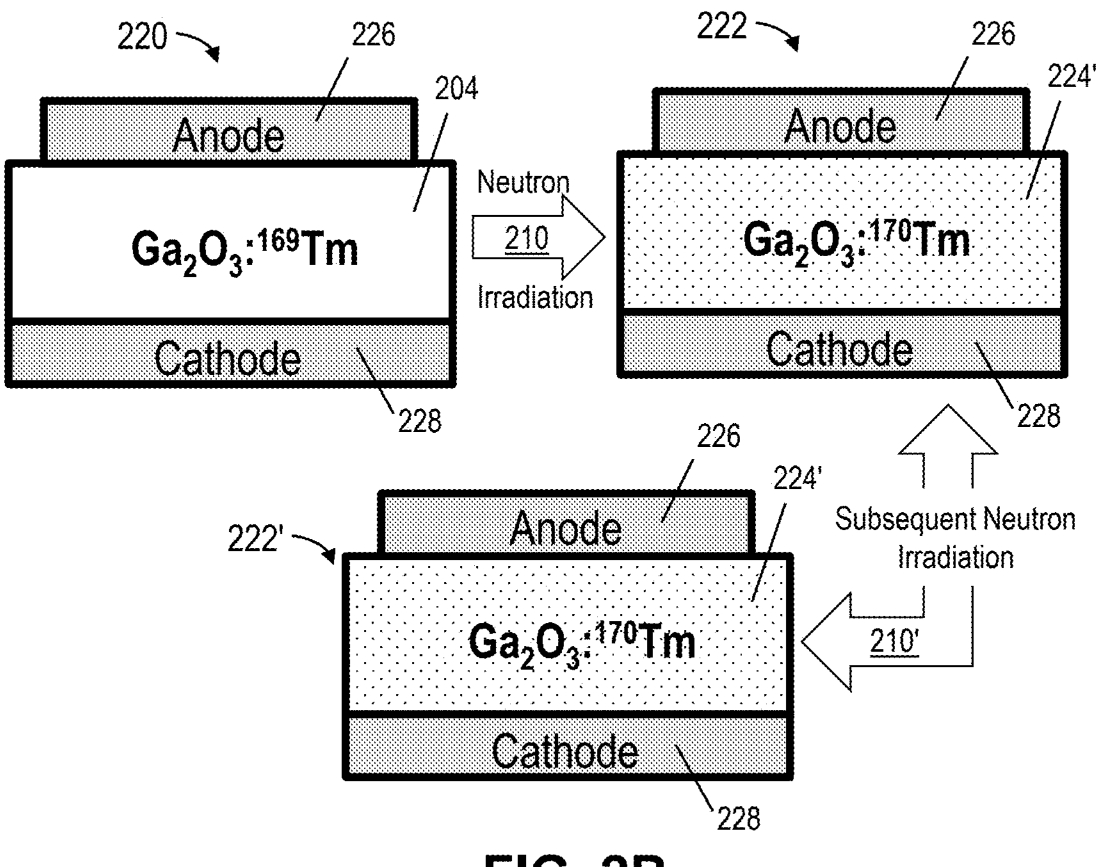
FIG. 2B shows the device and batteries of FIG. 1 in accordance with embodiments of the invention, wherein the semiconductor is gallium (III) oxide.

FIG. 2B shows an exemplary electrically inactive betavoltaic battery device 220, an electrically active betavoltaic battery 222 and a recharged electrically active betavoltaic battery 222' in accordance with embodiments of the invention. The exemplary electrically inactive betavoltaic battery device 220 of FIG. 2B includes at least one semiconductor material 224 comprising $Ga_2O_3$ doped with the only stable (observationally stable) isotope of thulium (Tm), Tm-169, and at least one diode comprising at least one anode 226, and at least one cathode 228. In implementations, the electrically inactive betavoltaic battery device 220 is exposed to thermal neutron irradiation at 210, which converts at least a portion of the Tm-169 in the semiconductor material 224 to the radioisotope Tm-170, resulting in the electrically active betavoltaic battery 222 including an emissive $Ga_2O_3$ substrate 224'. Electron-hole pair generation originates from in situ beta particle emission within the semiconductor $Ga_2O_3$ crystal, which acts both as an electron emitter and an absorber simultaneously. Rather than an ex situ deposited beta irradiation coating over the semiconductor absorber layer, embodiments of the invention leverage intentional dopants and/or unintentional impurities within a large-volume bulk $Ga_2O_3$ crystal.

Advantageously, implementations of the invention enable production of a stable electrically inactive betavoltaic battery device (e.g., 200, 220) in a conventional cleanroom without any special measures necessary to accommodate electronic device fabrication using radioactive semiconductor materials. The electrically inactive betavoltaic battery device (e.g., 200, 220) may then be transported to another location for irradiation to transform at least some of a stable isotope to a radionuclide, resulting in the electrically active betavoltaic battery (e.g., 202, 222).

The term radionuclide refers to a nuclide that has excess nuclear energy, making it unstable. This excess energy may be: emitted from the nucleus as gamma radiation; transferred to one of its electrons to release the energy as a conversion electron; or used to create and emit a new particle from the nucleus. In implementations, second and subsequent irradiation 210' of the electrically active betavoltaic battery (e.g., 202, 222) may be implemented to generate the recharged electrically active betavoltaic battery (e.g., 202', 222') via the same mechanism, as will be discussed in more detail below. Although the exemplary electrically inactive betavoltaic battery device 220 utilizes $Ga_2O_3$ as a host crystal for the stable isotope, it should be understood that embodiments of the invention may utilize different semiconductor materials or host crystals and/or stable isotopes, and the invention is not intended to be limited to the examples described herein.

Figure 3A:
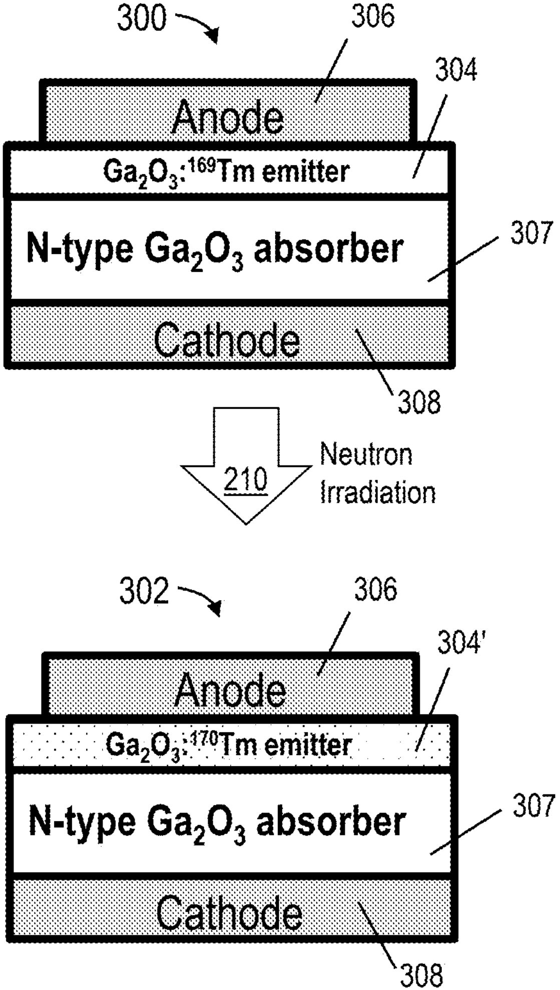
FIGS. 3A-3F show alternative embodiments of the inactive betavoltaic battery device and active betavoltaic battery of FIG. 2A.

FIGS. 3A-3F show alternative embodiments of the electrically inactive betavoltaic battery device and electrically active betavoltaic battery of FIG. 2A. More specifically, FIG. 3A depicts an electrically inactive betavoltaic battery device 300 in accordance with embodiments of the invention, including: a first semiconductor layer 304 comprising $Ga_2O_3$ doped with Tm-169, at least one diode comprising at least one anode 306 and at least one cathode 308, and a second semiconductor layer 307 comprising N-type $Ga_2O_3$ (an electron absorbing layer, a.k.a., absorber). In implementations, the electrically inactive betavoltaic battery device 300 is exposed to thermal neutron irradiation 210, which converts at least a portion of the Tm-169 in the first semiconductor layer 304 to the radioisotope Tm-170, resulting in an electrically active betavoltaic battery 302 including an electron (beta particle) emissive first semiconductor layer 304' (an electron emitting and absorbing layer) adjacent an electron absorbing semiconductor layer 307.

Figure 3B:
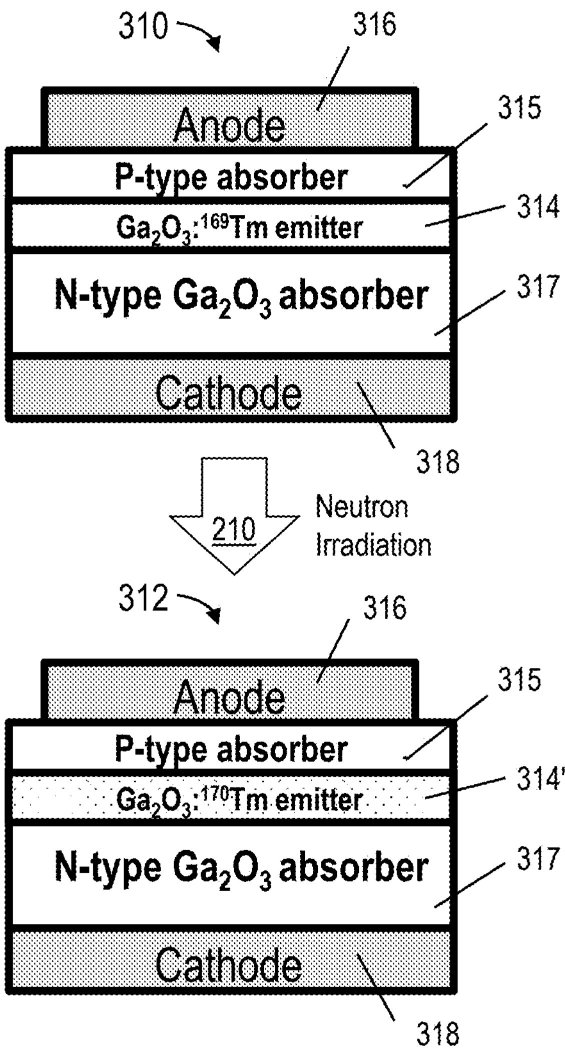

FIG. 3B depicts an electrically inactive betavoltaic battery device 310 in accordance with embodiments of the invention, including: a first semiconductor layer 314 comprising $Ga_2O_3$ doped with Tm-169, at least one diode comprising at least one anode 316 and at least one cathode 318, a second semiconductor layer 317 comprising N-type $Ga_2O_3$ (a first electron absorbing layer), and a third semiconductor layer 315 comprising a P-type semiconductor material (a second electron absorbing layer). In implementations, the electrically inactive betavoltaic battery device 310 is exposed to thermal neutron irradiation 210, which converts at least a portion of the Tm-169 in the first semiconductor layer 314 to the radioisotope Tm-170, resulting in an electrically active betavoltaic battery 312 including an electron (beta particle) emissive first semiconductor layer 314' (an electron emitting and absorbing layer) between the first and second electron absorbing layers 315 and 317.

Figure 3C:
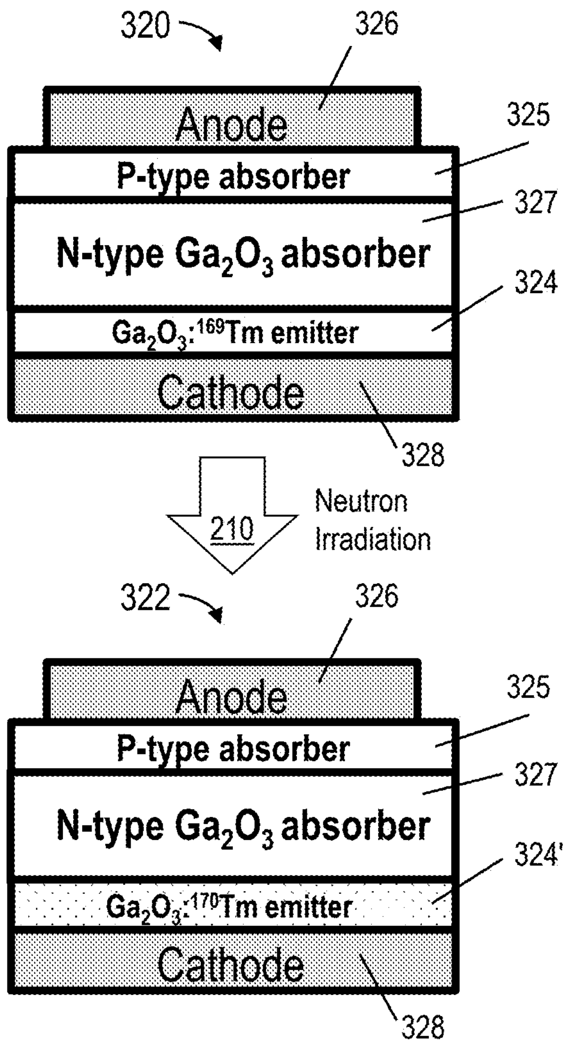

FIG. 3C depicts an electrically inactive betavoltaic battery device 320 in accordance with embodiments of the invention, including: a first semiconductor layer 324 comprising $Ga_2O_3$ doped with Tm-169, at least one diode comprising at least one anode 326 and at least one cathode 328, a second semiconductor layer 325 comprising a P-type semiconductor material (a first electron absorbing layer), and a second semiconductor layer 327 comprising N-type $Ga_2O_3$ (a second electron absorbing layer). In the example shown, the first semiconductor layer 324 is positioned below the first and second electron absorbing layers (layers 325 and 327). In implementations, the electrically inactive betavoltaic battery device 320 is exposed to thermal neutron irradiation 210, which converts at least a portion of the Tm-169 in the first semiconductor layer 324 to the radioisotope Tm-170, resulting in an electrically active betavoltaic battery 322 including an electron (beta particle) emissive first semiconductor layer 324' (an electron emitting and absorbing layer).

Figure 3D:
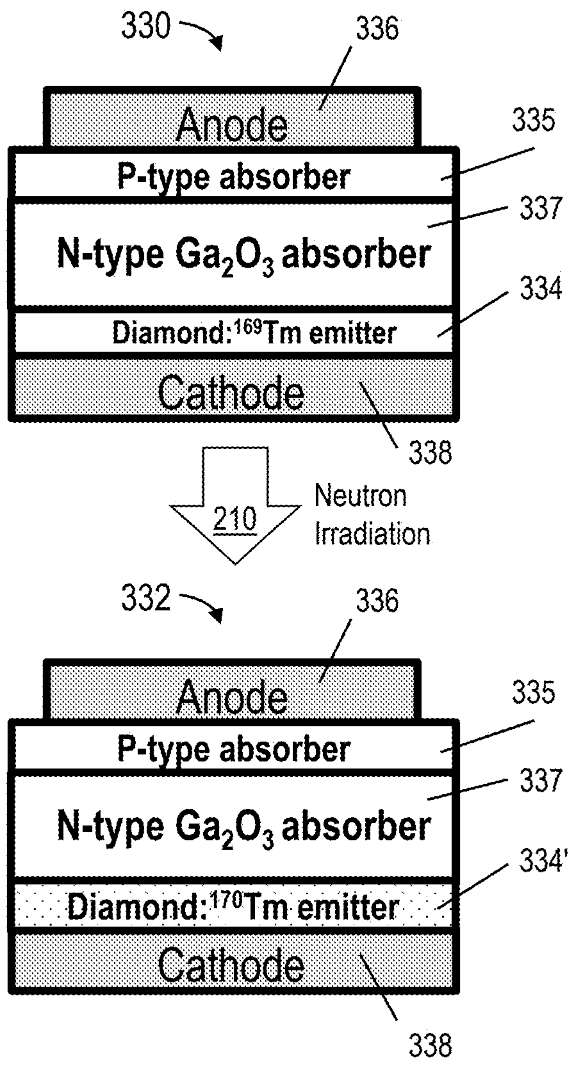

FIG. 3D depicts an electrically inactive betavoltaic battery device 330 in accordance with embodiments of the invention, including: a first semiconductor layer 334 comprising diamond doped with Tm-169, at least one diode comprising at least one anode 336 and at least one cathode 338, a second semiconductor layer 335 comprising a P-type semiconductor material (a first electron absorbing layer), and a third semiconductor layer 337 comprising N-type $Ga_2O_3$ (a second electron absorbing layer). In the example shown, the first semiconductor layer 334 is positioned below the first and second electron absorbing layers (layers 335 and 337). In implementations, the electrically inactive betavoltaic battery device 330 is exposed to thermal neutron irradiation 210, which converts at least a portion of the Tm-169 in the first semiconductor layer 334 to the radioisotope Tm-170, resulting in an electrically active betavoltaic battery 332 including an electron (beta particle) emissive first semiconductor layer 334' (a beta particle emitting and absorbing layer).

Figure 3E:
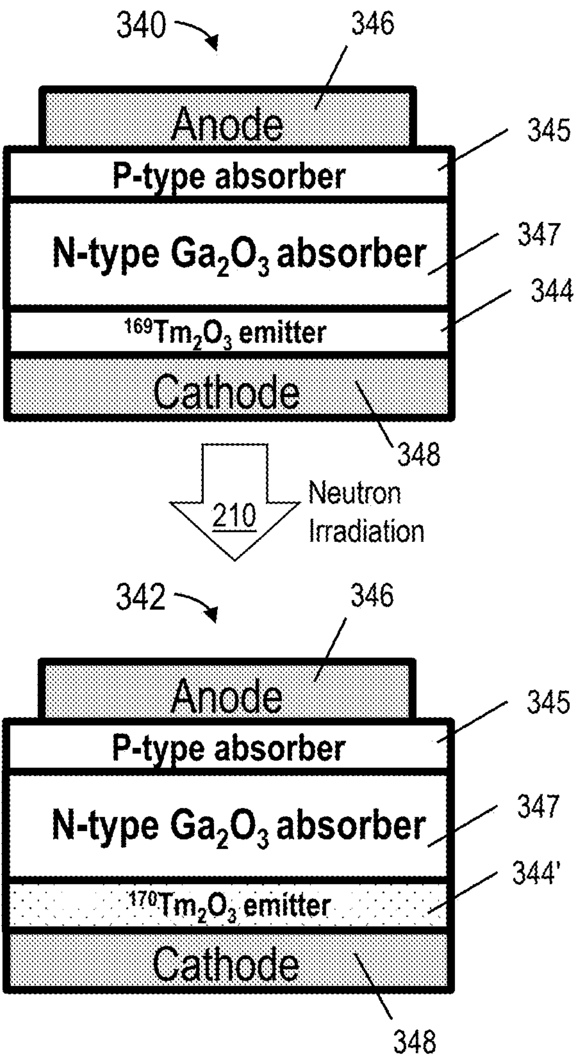

FIG. 3E depicts an electrically inactive betavoltaic battery device 340 in accordance with embodiments of the invention, including: a first semiconductor layer 344 comprising thulium oxide ($Tm_2O_3$) including Tm-169, at least one diode comprising at least one anode 346 and at least one cathode 348, a second semiconductor layer 345 comprising a P-type semiconductor material (a first electron absorbing layer) a third semiconductor layer 347 comprising N-type $Ga_2O_3$ (a second electron absorbing layer). In the example shown, the first semiconductor layer 344 is positioned below the first and second electron absorbing layers (layers 345 and 347). In implementations, the electrically inactive betavoltaic battery device 340 is exposed to thermal neutron irradiation 210, which converts at least a portion of the Tm-169 in the first semiconductor layer 344 to the radioisotope Tm-170, resulting in an electrically active betavoltaic battery 342 including an electron (beta particle) emissive first semiconductor layer 344' (an electron emitting and absorbing layer).

Figure 3F:
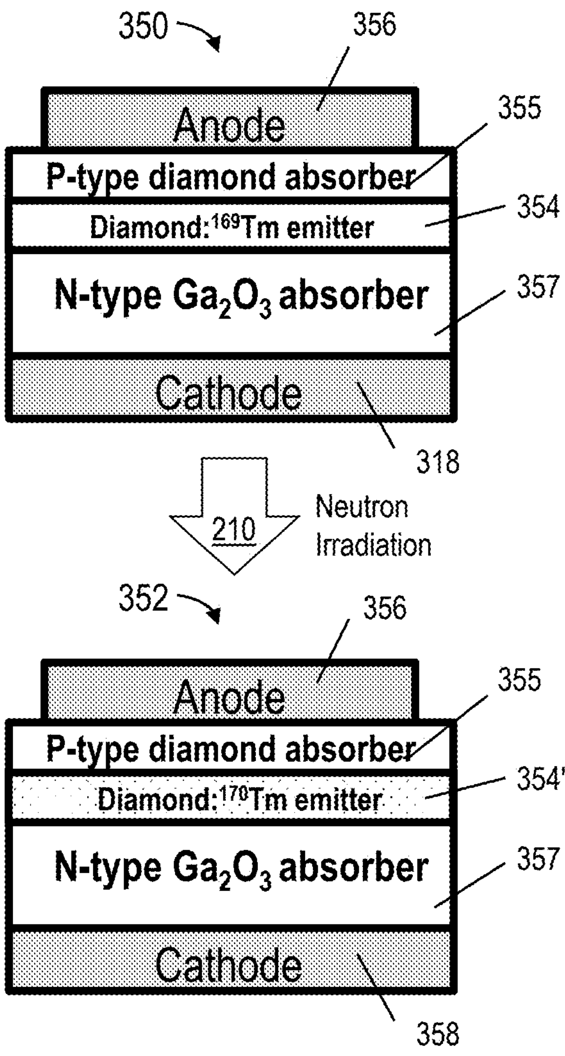

FIG. 3F depicts an electrically inactive betavoltaic battery device 350 in accordance with embodiments of the invention, including: a first semiconductor layer 354 comprising diamond including Tm-169, at least one diode comprising at least one anode 356 and at least one cathode 358, a second semiconductor layer 355 comprising a P-type diamond material (a first electron absorbing layer) a third semiconductor layer 357 comprising N-type $Ga_2O_3$ (a second electron absorbing layer). In the example shown, the first semiconductor layer 354 is positioned between the first and second electron absorbing layers (layers 355 and 357). In implementations, the electrically inactive betavoltaic battery device 350 is exposed to thermal neutron irradiation 210, which converts at least a portion of the Tm-169 in the first semiconductor layer 354 to the radioisotope Tm-170, resulting in an electrically active betavoltaic battery 352 including an electron (beta particle) emissive first semiconductor layer 354' (an electron emitting and absorbing layer).

Figure 4:
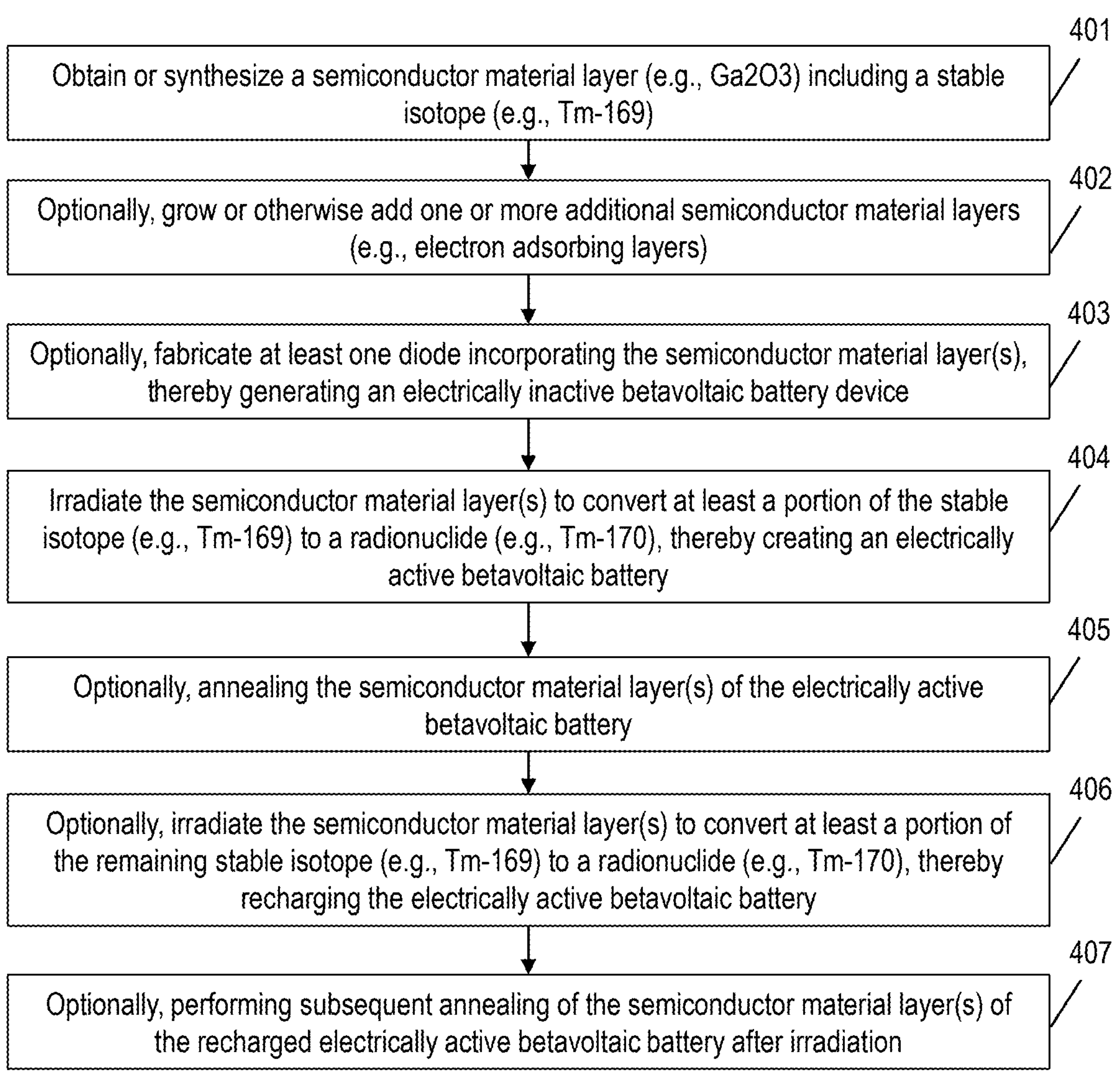
FIG. 4 shows a flowchart of an exemplary method in accordance with aspects of the present invention.

FIG. 4 illustrates method steps in accordance with embodiments of the invention. The method of FIG. 4 references the electrically inactive betavoltaic battery device 200, the electrically active betavoltaic battery 202, and the recharged betavoltaic battery 202' of FIG. 2A, but is not intended to be limited to the devices of FIG. 2A.

At step 401, a manufacturer obtains or synthesizes a semiconductor material layer (e.g., 204 of FIG. 2A) in the form of a substrate or an epitaxial layer either extrinsically doped with or naturally containing a stable isotope. In implementations, the stable isotope is Tm-169. In embodiments, the semiconductor material layer is selected from $Ga_2O_3$, diamond, $Tm_2O_3$, gallium nitride (GaN), SiC, aluminum nitride (AlN), Si, or other semiconductors appropriate for the stable isotope utilized. For example, those skilled in the art will recognize that it is not possible to dope some semiconductors with Tm-169, and some semiconductors would not be able to tolerate (would be excessively damaged by) beta irradiation arising from Tm-170.

In implementations, step 401 comprises growing $Ga_2O_3$ crystals utilizing existing techniques. In embodiments, beta (β) $Ga_2O_3$ is grown from a melt source using iridium (Ir) crucibles by the EFG method or the Cz method. However, Ir-192 is a known source of undesirable gamma-ray emission. Accordingly, in other embodiments of the invention, Ir-free $Ga_2O_3$ is grown via the float-zone (zone melting) method or vertical Bridgman method, another crucible-free or non-Ir crucible method, or another EFG or CZ technique where Ir incorporation in the $Ga_2O_3$ crystal is suppressed.

In implementations, the stable isotopes are introduced into the at least one host semiconductor material layer (e.g., 204) with precise quantity via doping near carrier generation sites where the beta electrons are actually needed, eliminating the need for coating the device with a beta irradiation source and improving the conversion efficiency of the resulting electrically active betavoltaic battery device (e.g., 202) by suppressing self-absorption effects.

Thermal neutron reactions by the stable isotopes of nitrogen-14, nickel-62, krypton-84, strontium-88, cadmium-112, iridium-191, and potentially other stable isotopes, can produce radionuclides such as carbon-14, nickel-63, krypton-85, strontium-90, cadmium-113 and iridium-192, respectively. Both carbon-14 and nickel-63 are known pure beta emitters with reasonably low energy. Krypton-85 and strontium-90 are also beta emitters but are commonly dismissed for betavoltaics as being too energetic for use with common semiconductors (e.g., Si and SiC). Cadmium-113 and iridium-192 have high energy beta decay but are also gamma emitters, to which $Ga_2O_3$ may exhibit reasonable tolerance, especially in the case of cadmium-113 whose gamma decay is only due to an isomeric transition. To date, no known technology exists that can harness the potentially ~10× higher beta decay energy of cadmium-113 ($E_{avg}$=185.4 keV) and strontium-90/yttrium-90 ($E_{avg}$=195.8 keV), compared to commonly used beta sources of hydrogen-3 ($E_{avg}$=5.7 keV), carbon-14 ($E_{avg}$=49.5 keV) and nickel-63 ($E_{avg}$=17.4 keV).

At the 185.4 and 195.8 keV beta decay energies of cadmium-113 and strontium-90/yttrium-90, respectively, $Ga_2O_3$ should be tolerant to electron irradiation. Electron irradiation at 1.5-2 MeV energy levels have been shown via electron paramagnetic resonance techniques to induce Ga vacancy related defects and result in degradation in Schottky barrier diode performance (on-resistance, on/off ratio, etc.). However, a betavoltaic cell operates in reverse bias mode and thus any Ga vacancy and related point defects generated by the radionuclide decay paths will cause degradation to the absorption efficiency of the betavoltaic cell if it captures generated electrons at a significantly higher rate than the electron-hole pair generation rate.

With respect to betavoltaic cells, the main disadvantage of the aforementioned isotopes is their natural occurrence in multiple stable isotopes. This would require doping of the host semiconductor material layer with isotopically pure elements, which is extremely expensive. From this standpoint, it is desirable to utilize an element which occurs naturally in only one stable isotope and can undergo a single-neutron capture reaction to produce a radionuclide without fissuring in the process (eliminating beryllium from consideration), which then decays only through beta particles directly into a stable isotope. One element that comes close to this specification is thulium (Tm). The only stable isotope of Tm, Tm-169, forms Tm-170 upon single neutron capture, which has a 99.86% probability of decaying to stable ytterbium-170 (Yb-170) via pure beta ($\beta^-$) emission with a reasonably long half-life of 128.6 days. The remaining 0.14% emission decays to stable erbium-170 via electron recapture consisting of 0.11% ground state decay and 0.03% photon emission to the first excited state. Therefore, for every 10000 decays worth of energy there will be three (3) photons emitted with 78 keV of energy. Tm also exhibits a large neutron capture cross section. Furthermore, any double neutron capture resulting in Tm-171 also decays via beta emission (1.92 year half-life) to stable Yb-171. This makes Tm an excellent candidate for betavoltaic applications if only neutron capture reactions are considered.

Accordingly, in implementations, a host semiconductor material layer (e.g., $Ga_2O_3$) is doped with or naturally contains the stable isotope Tm-169. In general, isotopically-pure elements are very expensive. Advantageously, Tm has a single stable isotope (Tm-169), and does not require costly isotope enrichment; provides a large neutron capture cross section (100 barns); and becomes a pure beta emitter, Tm-170 (max beta energy 968 KeV), upon single neutron capture. Specifically, Tm-170 is a 99.97% beta-emitter decaying to stable ytterbium-170 (Yb-170) and erbium (Er), with no further decay, and requires little gamma shielding (0.03% gamma rays). In implementations, $Tm_2O_3$ is used as a source of Tm for doping of the host semiconductor material layer (e.g., $Ga_2O_3$) or as the host semiconductor material layer. $Tm_2O_3$ is a low-cost oxide powder available commercially with four nines (4N) purity and can be alloyed into a host crystal of a semiconductor material layer (e.g., 204) during melt growth.

Certain advantages may be obtained when $Ga_2O_3$ is utilized as the host semiconductor material layer. The strong polaron effects in $Ga_2O_3$ leading to the self-trapping of holes means that any generated holes will be trapped almost immediately, resulting in excess electron concentration available for transport upon the application of an electric field. Additionally, the ability to generate relatively large diameter $Ga_2O_3$ wafers and thick epitaxial layers of $Ga_2O_3$ offer significant technological advantages in that $Ga_2O_3$ can be utilized to create a relatively large collection area for a battery, as compared to a battery made from another crystalline material. Accordingly, embodiments of the invention utilize $Ga_2O_3$ as a host semiconductor material layer.

In implementations, the Tm metal organic chemical vapor deposition (MOCVD) precursor thulium (III) tris(2,2,6,6-tetramethyl-3,5-heptanedionate) is utilized to grow Ir-free $Ga_2O_3$ via the float-zone method. Various doping methods may be used in accordance with embodiments of the invention. In one implementation, a $Ga_2O_3$ layer is doped with Tm-169 deposited via an epitaxial growth doping method, such as metalorganic chemical vapor deposition (MOCVD), molecular beam epitaxy (MBE), halide vapor phase deposition (HVPE), pulsed laser deposition (PLD), etc. In embodiments, an annealing step is performed after doping of the $Ga_2O_3$ semiconductor material layer, particularly for the purpose of lattice damage recovery if ion implantation of Tm-169 is used. Various annealing methods may be utilized in accordance with embodiments of the invention.

With continued reference to FIG. 4, optionally at step 402, a manufacturer grows or otherwise adds one or more additional semiconductor material layers (e.g., electron absorbing layers of either p-type or n-type conductivity) to the host semiconductor material layer including the stable isotope of step 401. See, for example, the semiconductor layers 315 and 317 of FIG. 3B.

At step 403, a manufacturer fabricates at least one diode (e.g., comprising an anode 206 and a cathode 208) incorporating the semiconductor material layer(s) (e.g., 204 of FIG. 2A). Various methods may be utilized to fabricate the at least one diode, and the present invention is not intended to be limited to a particular method of diode fabrication. Alternatively, the user may obtain a pre-fabricated semiconductor device at step 401 having at least one diode incorporating the semiconductor material layer(s). In implementations an anode (e.g., 206) and cathode (e.g., 208) are fabricated on opposing surfaces of the host semiconductor material layer (e.g., 204 of FIG. 2A) doped with a stable isotope (e.g., Tm-169). The diode may comprise a $Ga_2O_3$ substrate, a $Ga_2O_3$ epitaxial layer, another semiconductor substrate or epitaxial layer, or a junction of a heteroepitaxial semiconductor layer on a dissimilar semiconductor substrate, for example.

At step 404, a manufacturer irradiates the semiconductor material layer(s) (e.g., 204 of FIG. 2A) of the electrically inactive betavoltaic battery device (e.g., 200) to convert at least a portion of the stable isotope (e.g., Tm-169) therein to a radionuclide (e.g., Tm-170), thereby creating an electrically active betavoltaic battery (e.g., 202). In implementations, step 404 (thermal neutron irradiation) is performed at a nuclear reactor physically or geographically remote from the semiconductor fabrication location of steps 401-403, thereby enabling special safety precautions to be taken only at the irradiation stage, without the need for special safety precautions at the manufacturing stages (steps 401-403).

In implementations, the initial doping agent is Tm-169, resulting in minimal gamma-ray emissions from a Tm-170 electron capture process in the electrically active betavoltaic battery (e.g., 202), where the minimal gamma-ray emission can be shielded in a relatively straightforward and safe manner by the semiconductor diode package. Simulations indicate about 100-200 microns (μm) of beta electron penetration in $Ga_2O_3$ from Tm-170 decay. Advantageously, implementations of the invention require minimal thermal neutron irradiation in the range of minutes or a few hours rather than days (as compared to betavoltaic battery devices utilizing other radionuclides), due to the large neutron capture cross section of Tm-170. In general, $Ga_2O_3$ devices have shown high on-state current density and low reverse bias current, making $Ga_2O_3$ devices appropriate semiconductor absorbers for beta-emitter dopants in the drift region.

Moreover, $Ga_2O_3$ is tolerant to beta irradiation, and the high energy of beta electrons from Tm-170 is not expected to result in significant $Ga_2O_3$ crystal damage over the life of active $Ga_2O_3$ betavoltaic batteries in accordance with embodiments of the invention.

Optionally, at step 405, annealing of the semiconductor material layer(s) (e.g., 204) of the active betavoltaic battery (e.g., 202) is performed. In implementations, the annealing step repairs damage to the crystals (e.g., $Ga_2O_3$) in the semiconductor material layer(s) that occurs during the irradiation step 404. Various annealing processes may be utilized, and the invention is not intended to be limited to a particular type of annealing method.

Optionally, at step 406, a manufacturer performs a second or subsequent irradiation of the semiconductor material layer(s) (e.g., 204) of the electrically active betavoltaic battery (e.g., 202) to convert at least a portion of the remaining stable isotope (e.g., Tm-169) into a radionuclide (e.g., Tm-170), resulting in a recharged active betavoltaic battery (e.g., 202' of FIG. 2A). In embodiments utilizing Tm-169, after a period of time, a significant portion of the Tm-170 in the active betavoltaic battery (e.g., 202) will have degraded to ytterbium-170 (Yb-170) and erbium (Er) (i.e., the active betavoltaic battery will be in a degraded state), slowing energy production of the battery. By converting any remaining stable isotope (Tm-169) in the active betavoltaic battery to a radionuclide (Tm-170) via irradiation, the active betavoltaic battery will be recharged and will generate more energy than in the degraded state. In implementations, the second or subsequent irradiation of a semiconductor material layer (e.g., 204 of FIG. 2A) originally doped with Tm-169 will result in conversation of at least some of the remaining stable isotope Tm-169 to Tm-170, and will convert at least a portion of any remaining Tm-170 to Tm-171 (having a half-life of 1.92 years), resulting in a recharged electrically active betavoltaic battery 202. At the end of battery life, implementations of the invention originally doped with Tm-169 will result in class A waste, which is the least radioactive level of any nuclear waste.

Optionally, at step 407, subsequent annealing of the semiconductor material layer(s) (e.g., 204) of the recharged electrically active betavoltaic battery (e.g., 202) is performed. In implementations, the annealing step repairs damage to the crystals in the semiconductor material layer(s) (e.g., $Ga_2O_3$) that occurs during the second or subsequent irradiation steps. Various annealing processes may be utilized, and the invention is not intended to be limited to a particular type of annealing method.

In use, an electrically active betavoltaic battery of the present invention (e.g., 202' of FIG. 2A) produces electron hole pairs from energetic beta particles emitted from one or more radionuclides (e.g., Tm-170, Tm-171) within the host semiconductor material layer (e.g., 204') positioned between an anode (e.g., 206) and a cathode (e.g., 208). The electron hole pairs are mobile under the effect of an electric field existing between the anode and cathode, thereby generating electrical energy.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

REFERENCES

1. Joel B. Varley, Anderson Janotti, Cesare Franchini, and Chris G. Van de Walle. "Role of self-trapping in luminescence and p-type conductivity of wide-band-gap oxides." *Physical Review B* 85, no. 8 (2012): 081109.
2. Lee, Jonathan, Elena Flitsiyan, Leonid Chernyak, Jiancheng Yang, Fan Ren, Stephen J. Pearton, Boris Meyler, and Y. Joseph Salzman. "Effect of 1.5 MeV electron irradiation on β-Ga2O3 carrier lifetime and diffusion length." Applied Physics Letters 112, no. 8 (2018).
3. Dang, T., M. Konczykowski, H. Jaffres, V. I. Safarov, and H-J. Drouhin. "Modification of β-gallium oxide electronic properties by irradiation with high-energy electrons." Journal of Vacuum Science & Technology A 40, no. 3 (2022).

What is claimed is:

1. A method of making an electrically active betavoltaic battery comprising:

providing an electrically inactive betavoltaic battery device having one or more diodes incorporating a semiconductor material layer including a stable non-radioactive isotope; and irradiating the electrically inactive betavoltaic battery device with thermal neutrons, thereby causing the conversion of at least a portion of the stable non-radioactive isotope to a radionuclide and creating the electrically active betavoltaic battery, wherein the semiconductor material layer acts as both an electron emitter and an electron absorber simultaneously.

2. The method of claim 1, wherein the stable non-radioactive isotope is thulium-169 and the radionuclide is thulium-170.

3. The method of claim 1, wherein the semiconductor material layer is selected from the group consisting of: diamond, thulium oxide, aluminum nitride, aluminum gallium nitride, gallium nitride, silicon carbide, gallium oxide, aluminum gallium oxide, zinc oxide, and silicon.

4. The method of claim 3, wherein the semiconductor material layer comprises gallium oxide, and the method further comprises growing the semiconductor material layer with the stable non-radioactive isotope using an epitaxial growth doping method.

5. The method of claim 3, wherein the semiconductor material layer comprises iridium-free β-gallium oxide.

6. The method of claim 1, further comprising irradiating the electrically active betavoltaic battery after a period of time has elapsed since the irradiating the electrically inactive betavoltaic battery device with thermal neutrons and a portion of the radionuclide has been converted into one or more stable isotopes thus depleting an electrical charge in the electrically active betavoltaic battery, thereby converting at least a portion of remaining stable non-radioactive isotope in the electrically active betavoltaic battery to the radionuclide, resulting in a recharged electrically active betavoltaic battery.

7. The method of claim 1, wherein the electrically inactive betavoltaic battery device includes one or more additional semiconductor material layers, different from the semiconductor material layer including the stable non-radioactive isotope, that act as electron absorbers.

8. The method of claim 1, further comprising fabricating the one or more diodes such that the one or more diodes incorporate the semiconductor material layer including the stable non-radioactive isotope.

9. The method of claim 8, wherein the one or more diodes comprise an anode fabricated at a first surface of the semiconductor material layer and a cathode fabricated at a second surface of the semiconductor material layer.

10. The method of claim 1, further comprising annealing the electrically active betavoltaic battery to repair crystal damage in the semiconductor material layer caused by the irradiation.

11. A method of making an electrically inactive betavoltaic battery device comprising:

fabricating a semiconductor material layer containing a stable isotope; and fabricating one or more diodes such that the one or more diodes incorporate the semiconductor material layer, thereby creating the electrically inactive betavoltaic battery device, wherein the electrically inactive betavoltaic battery device is configured to be transformed into an electrically active betavoltaic battery upon irradiation with thermal neutrons.

12. The method of claim 11, wherein the stable isotope is thulium-169, which converts to thulium-170 upon irradiation with thermal neutrons.

13. The method of claim 11, wherein the semiconductor material layer is selected from the group consisting of: diamond, thulium oxide, aluminum nitride, aluminum gallium nitride, gallium nitride, silicon carbide, gallium oxide, aluminum gallium oxide, zinc oxide, and silicon.

14. The method of claim 11, wherein the fabricating the semiconductor material layer containing the stable isotope comprises doping the semiconductor material layer with the stable isotope.

15. The method of claim 14, wherein the semiconductor material layer comprises iridium-free β-gallium oxide.

16. The method of claim 11, wherein the one or more diodes comprise an anode fabricated at a first surface of the semiconductor material layer and a cathode fabricated at a second surface of the semiconductor material layer.

17. The method of claim 11, further comprising annealing the semiconductor material layer.

18. An electrically inactive betavoltaic battery device comprising:

a semiconductor material layer including a stable isotope; and one or more diodes incorporating the semiconductor material layer, wherein the electrically inactive betavoltaic battery device is configured to be transformed into an electrically active betavoltaic battery upon irradiation with thermal neutrons.

19. The electrically inactive betavoltaic battery device of claim 18, wherein the stable isotope is thulium-169, which converts to thulium-170 upon irradiation with thermal neutrons.

20. The electrically inactive betavoltaic battery device of claim 18, wherein the semiconductor material layer comprises iridium-free β-gallium oxide.

* * * * *